(12) United States Patent
Babcock et al.

(10) Patent No.: US 6,595,605 B1
(45) Date of Patent: Jul. 22, 2003

(54) SPRING LOADED LATCHING FOR SYSTEM ENCLOSURE PANELS

(75) Inventors: Raymond Floyd Babcock, Stewartville, MN (US); Matthew Allen Butterbaugh, Rochester, MN (US); David George Lund, Byron, MN (US); John Harold Mohlke, Pine Island, MN (US); Christopher Lee Tuma, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 09/712,502

(22) Filed: Nov. 14, 2000

(51) Int. Cl.[7] ................................. H05K 7/18
(52) U.S. Cl. .................. 312/223.2; 312/296; 292/87
(58) Field of Search .................... 312/223.2, 223.1, 312/326, 327, 328, 329, 296; 292/80, 81, 87

(56) References Cited

U.S. PATENT DOCUMENTS

| | | | | |
|---|---|---|---|---|
| 4,971,371 A | * | 11/1990 | Gunderson | |
| 5,256,833 A | * | 10/1993 | Schwenk | |
| 5,717,571 A | | 2/1998 | Helot | |
| 5,886,868 A | * | 3/1999 | White et al. | |
| 5,907,962 A | | 6/1999 | Smithson et al. | |
| 6,130,822 A | * | 10/2000 | Della Fiora et al. | |
| 6,134,116 A | * | 10/2000 | Hoss et al. | |
| 6,189,938 B1 | * | 2/2001 | Nakadaira et al. | 292/87 |
| 6,227,632 B1 | * | 5/2001 | Liu | 312/223.2 |
| 6,283,512 B1 | * | 9/2001 | Butterbaugh et al. | |

* cited by examiner

*Primary Examiner*—Janet M. Wilkens

(57) ABSTRACT

A chassis for a computer, computer related or other electronic device includes a door that closes an access opening in the chassis when in the closed position and permits access to the interior of the chassis when opened for a user or service technician. A latch releasably secures the door in the closed position and is operable by a user or service technician for opening the door from the closed position and closing the door from the open position without the benefit of a screwdriver, wrench or other tool. In selected embodiments, the latch is biased to account for compression reaction forces of a seal or gasket surrounding the access opening while still providing for manual manipulation of the door and access to the interior of the chassis.

6 Claims, 4 Drawing Sheets

SPRING LOADED LATCHING FOR SYSTEM ENCLOSURE PANELS

FIELD OF THE INVENTION

The invention is generally related to a chassis for an electronic device. More specifically, the invention is generally related to a specially designed latching mechanism for an access door mountable in an opening in an exterior housing or chassis of a computer related or other electronic device.

BACKGROUND OF THE INVENTION

Many computer related devices generally include a chassis with a number of individual components mounted therein and connected to one another by wires, cables, brackets, nuts, bolts and the like. Commonly, such computer related internal components include printed circuit boards, hard disk drives, optical disk drives, floppy disk drives, tape drives, memory cards, fax/modem devices and the like. The chassis typically includes a housing often formed of sheet metal and/or molded plastic material and is provided with access openings to afford users access to the devices within the housing or chassis. Housing openings of this sort are typically provided with an access door or similar structure to selectively block and expose the access opening.

The frequent insertion and removal of modular components, printed circuit boards and the like from computer related or electronic devices is very common. The removability of computer components allows for better overall serviceability of the computer system and is a distinct advantage to both the user and the maintenance technician. Modular components and connectors facilitate prompt replacement and convenient reconfiguration of the computer related or electronic device to meet changing service requirements and demands.

Various types of access door structures have previously been utilized on computers and similar types of electronic devices. One such prior art design involves the use of screws or bolts that engage openings in the door and corresponding openings in the computer chassis. Use of screws, bolts or other mechanical fasteners means that a screw driver, wrench or other tool is required to remove the door and access the internal components of the computer or electronic device. The process of removing and replacing multiple screws, bolts or other fasteners takes a significant amount of time. Furthermore, screws, bolts and mechanical fasteners are not desirable as they are difficult to manipulate and they require a tool for installation and removal. Further, screws, bolts and other mechanical fasteners can be easily lost or misplaced during the removal and replacement of the access door.

Another prior design that has been utilized to secure a door on a chassis of a computer related or electronic device is the use of plastic push-pull plunger-type fasteners. The use of fasteners of this type likewise requires painstaking effort by the service technician or computer user to individually secure and remove the fasteners, with or without a tool, each time the door is opened or closed. Further, fasteners of this type present additional problems. For example, many computer or electronic related devices have an electromagnetic conductive (EMC) gasket or seal surrounding the access opening. When the door is closed, the EMC seal or gasket provides a barrier between the outside environment and the internal computer components. The access door must be well grounded to the chassis with a continuous conductive seal between the door and the chassis along the perimeter of the access opening. The EMC seal or gasket is often compressible to provide an effective EMC barrier when the door is closed. Therefore, the seal is compressed between the door and the chassis in the closed configuration. The compression forces of the gasket or seal often overcome the plastic push-pull plunger-type fasteners thereby dislodging them and/or the door. Furthermore, it is often difficult for a user to effectively close the door tightly against the chassis and seal with the door drawn uptight against the chassis and seal prior to installing or engaging the push-pull plunger-type fasteners. As a result, the use of fasteners of this type is very difficult, time consuming and often ineffective to reliably close the access door and establish an EMC barrier.

Therefore, in view of these and other problems associated with known types of access door structures, there is a need for an access door that can be selectively opened and closed, and that is easy to operate and effectively secure in a closed position even when the EMC seal or gasket is in place. Further, the door design and closure mechanism is preferably inexpensive to manufacture and capable of being efficiently and effectively utilized by a user or service technician.

SUMMARY OF THE INVENTION

This invention meets and exceeds the above-described and other needs by providing a latching mechanism for access doors on computer related and other electronic devices and an associated method for opening and closing the access doors. In a present embodiment of this invention, a chassis for a computer related or electronic device includes a housing and an access opening in the housing through which access to the interior components is available for a user or service technician. A door is mounted to the housing for movement to and between closed and open positions in which the door inhibits access through the access opening when in the closed position and permits access to the access opening when in the open position. A latch releasably secures the door in the closed position and is operable by a user or service technician for opening the door from the closed position and closing the door from the open position without the benefit of a screwdriver, wrench or other tool. Further, the latch mechanism requires no positive latching action or manipulation by the user when closing the door. The user simply pulls or pushes on the grip to open and close the door. In one embodiment, a hinge pivotally couples the door to the housing and the latch is mounted on an opposite edge of the door from the hinge. The door includes a grip to be grasped by a user or service technician for selectively opening and closing the door.

When the computer related device includes a compressible seal or gasket surrounding the opening, the latch according to one embodiment of this invention advantageously is biased by a spring or other mechanism to account for the compression reaction forces produced by the seal or gasket. The spring or otherwise biased latch cooperates with a catch on the housing to positively secure the door in the closed position and overcome the compression reaction forces of the seal or gasket.

As a result, this invention overcomes the above described problems by providing convenient access to the inner components of a computer related or electronic device without the need for tools or other complicated systems. For ease of access, the user or service technician removes the door without having to use a tool such as a screwdriver or wrench. The user simply pulls on the handle. There are no fasteners that must be individually engaged or disengaged to operate the door.

These and other advantages and features which characterize the invention, are set forth in the claims annexed hereto and forming a further part hereof. However, for a better understanding of the invention, and of the advantages and objectives attained through its use, reference should be made to the drawings, and to the accompanying descriptive matter, in which they are described exemplary embodiments of the invention.

BRIEF DESCRIPTION OF THE DRAWINGS

The objectives and features of the invention will become more readily apparent from the following detailed description taken in conjunction with the accompanying drawings in which.

DETAILED DESCRIPTION OF THE INVENTION

Figure 1:
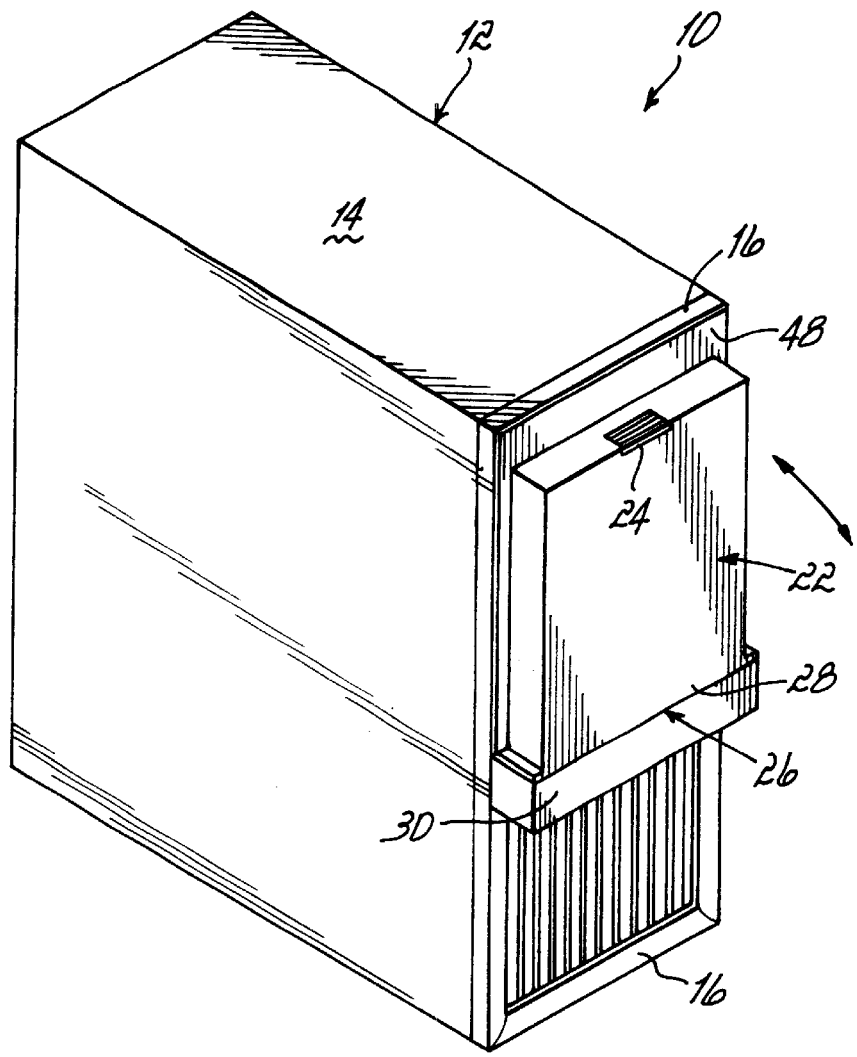
FIG. 1 is a perspective view of one present embodiment of a computer with an access door mounted to chassis of the computer according to this invention.

Turning to the drawings, wherein like numbers denote like parts throughout the several views, FIG. 1 shows a first embodiment of a computer or similar electronic device 10. The computer 10 has a generally rectangular chassis 12 which includes a housing 14 with a front panel 16 mounted on a front face of the computer 10. The front panel 16 of the housing is a generally rectangular molded plastic, metal or other component that includes an access opening 18 through which a user or service technician may gain access to the interior of the computer 10 for installing or removing a disk drive (FIG. 2) or other component 20. It should be readily understood that the description, configuration, design and arrangement of the housing, chassis, panel, access opening and disk drive, component shown in FIG. 1 are exemplary only and not a limitation on this invention.

Figure 2:
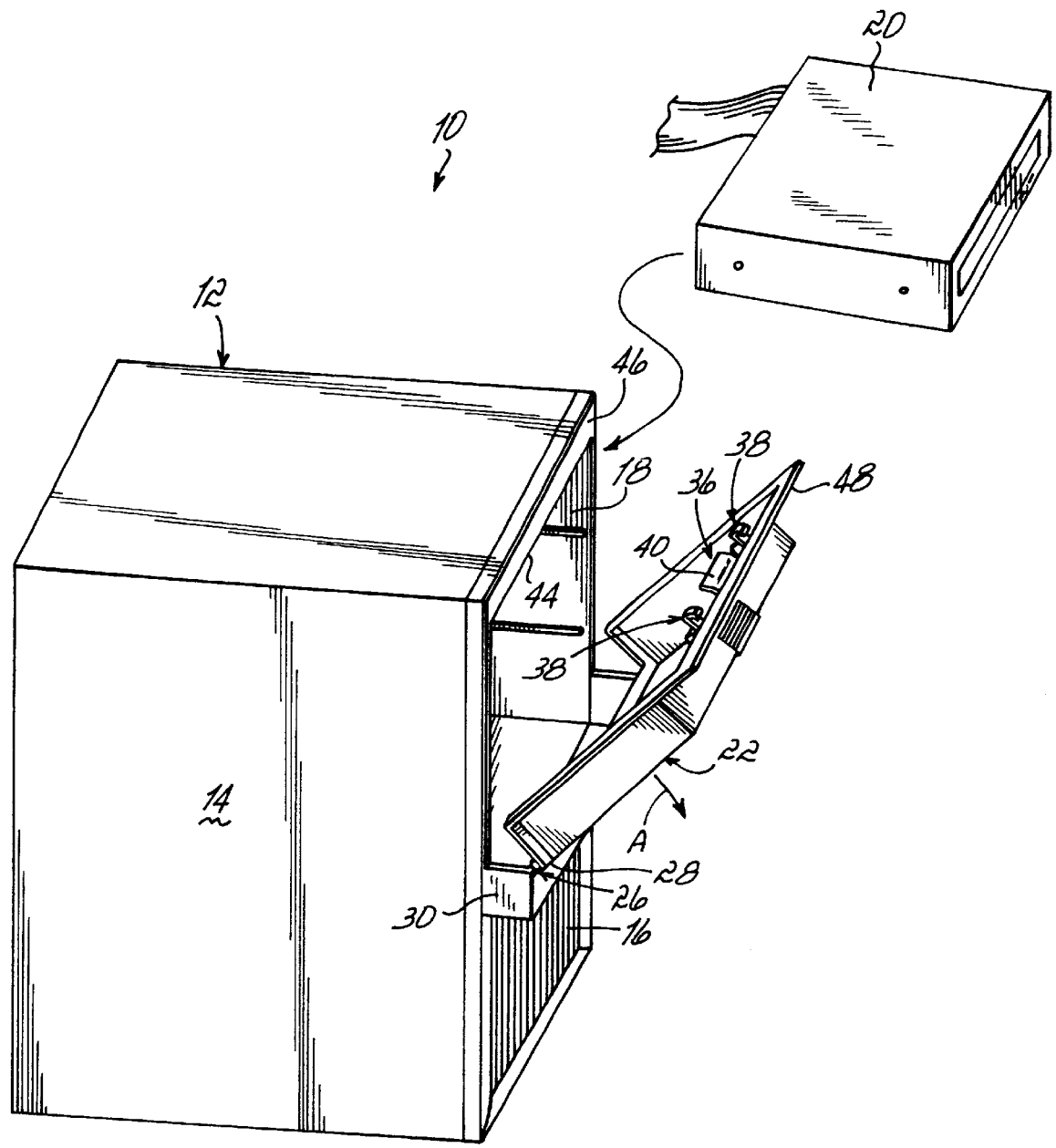
FIG. 2 is a respective view of the computer of FIG. 1 with the door pivoting toward an open position after a latch on the door is disengaged so that a disk drive or other component may be inserted through an access opening and into the computer.

A door 22 is mounted to the panel 16 for movement to and between a closed position as shown in FIG. 1 and an open position as shown in FIG. 2. In the closed position, the door 22 inhibits access through the access opening 18 by blocking or closing all of the access opening 18 as shown in FIG. 1. The door 22 permits at least partial access through the access opening 18 in the open position. A grip or handle 24 is provided on the door 22 for convenient manual grasping and manipulation of the door 22 to and between the closed and open positions.

Figure 3:
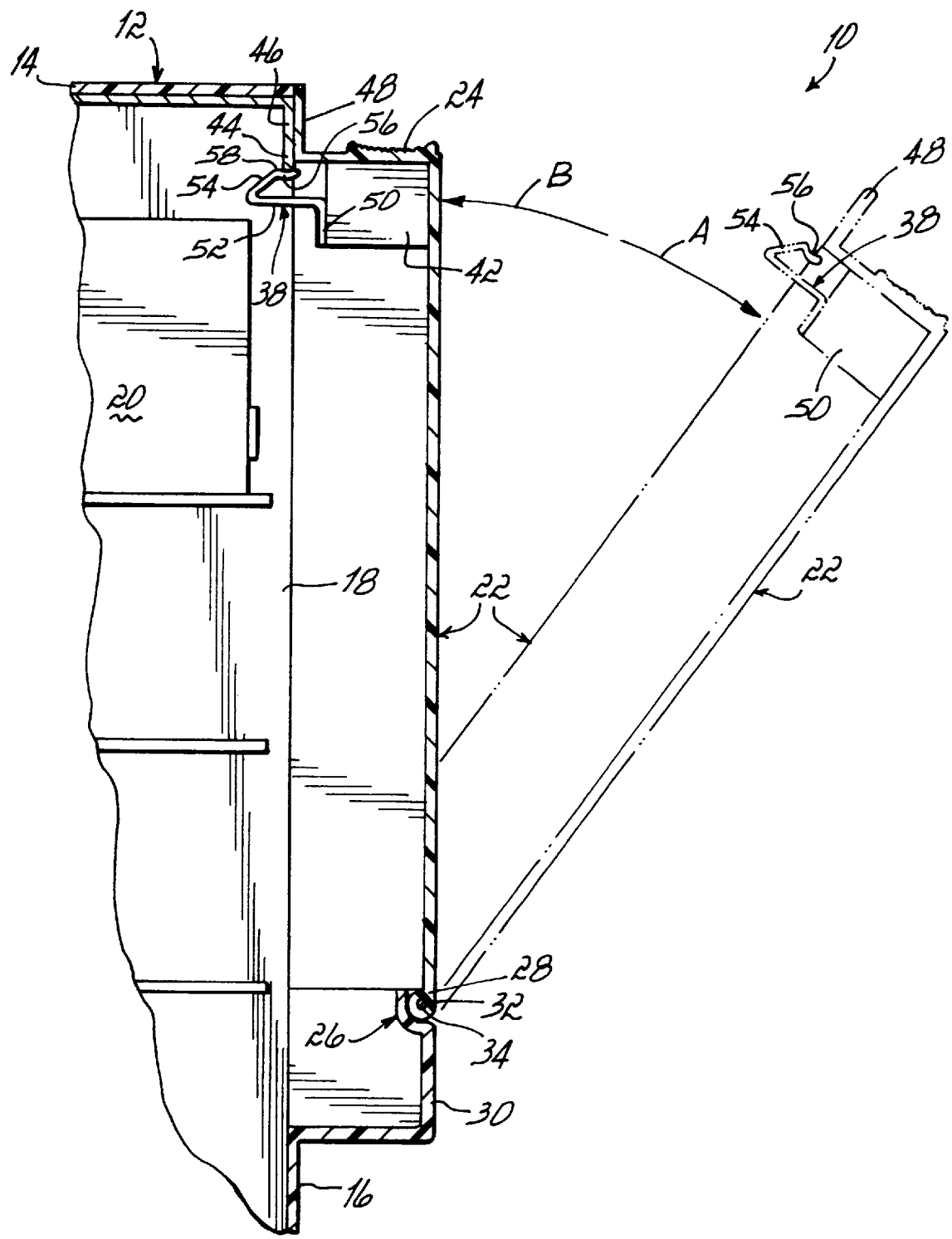
FIG. 3 is a cross-sectional side elevational view of the computer and access door of FIGS. 1 and 2.

The door 22 is pivoted to and between the open and closed positions about a hinge assembly 26 which pivotally mounts a lower edge 28 of the door 22 to a mating ledge 30 on the front panel 16 of the computer 10. The hinge assembly 26 may include a number of tubular ferrules 32 projecting from the lower edge 28 of the door 22 and from the ledge 30 and a hinge pin 34 extending through the mating ferrules 32 to pivotally couple the door 22 to the chassis 12 of the computer 10, as best shown in FIG. 3. However, it should be readily understood that the pivotal coupling of the door 22 to the chassis 12 is only one possible mounting scheme for the door 22. A wide range of other attachment mechanisms could be employed for coupling the door 22 to the chassis 12 for movement between the opened and closed positions within the scope of this invention. For example, and without limitation, the door could be mounted for sliding or rolling movement between open and closed positions, coupled to the chassis by a living hinge or the door could be selectively attached and detached from the chassis within the scope of this invention.

This invention includes a latch 36 to releasably secure the door 22 in the closed position. In the embodiment shown in FIGS. 1–3, the latch 36 includes a pair of spaced spring clips 38 with a tongue 40 positioned therebetween and projecting from an upper flange 42 of the door 22. Each spring clip 38 and the tongue 40 of the latch 36 in the embodiment of FIGS. 1–3 are designed, configured and positioned to selectively and releasably engage a downwardly projecting catch 44 along a lowermost edge of a downwardly depending flange 46 of the chassis 12. An upwardly projecting lip 48 of the door 22 along the top edge thereof is juxtaposed in face to face abutting relationship with the downwardly depending flange 46 on the chassis 12 when the door 22 is in the closed position as shown in FIG. 3.

A downwardly depending leg 50 of each spring clip 38 is mounted on the door 22. A main body portion 52 of the spring clip 38 projects perpendicularly from the leg 50. An upwardly and angularly oriented upper arm portion 54 of the spring clip 38 projects from the main body portion 52 along an opposite edge thereof from the leg 50. The upper arm 54 is joined to a depressed or cup-shaped terminal end portion 56 of the spring clip 38 which, when the door 22 is in the closed position, engages the catch 44 on the chassis 12 of the computer 10 or other electronic device as shown in FIG. 3. A shoulder 58 of each spring clip 38 joins the arm 54 to the terminal end portion 56.

Advantageously, the latch 36 according to this invention is biased into engagement with the catch 44 to releasably secure the door 22 in the closed position. Additionally, the user or service technician can easily reposition the door 22 between the open and closed positions without the benefit of tools or additional mechanical fasteners as in prior art designs. Specifically, to open the door 22 from the closed position, the user grasps the grip 24 manually or otherwise to pivot the door 22 downwardly in the direction of arrow A of FIGS. 2 and 3 about the hinge 26 toward the open position. To disengage the latch 36 from the catch 44 and open the door 22 according to this embodiment of the invention, the bias of the spring clips 38 will be overcome to thereby temporarily deflect the arm 54 and terminal portion 56 of each spring clip 38 downwardly. Once the catch 44 passes the shoulder 58 joining the arm 54 and terminal end portion 56 of each spring clip 38, the door 22 will be free to pivot and the latch 36 will be disengaged so that convenient and easy access to the interior of the computer or other electronic device 10 is available.

Similarly, to close the access opening 18 with the door 22, the user or service technician manually grasps the grip 24 or other portion of the door 22 to pivot it about the hinge 26 upwardly in the direction of arrow B of FIGS. 2 and 3 toward the closed position. The catch 44 on the chassis 12 initially contacts the angularly sloped arms 54 of the spring clips 38 to temporarily deflect them downwardly toward the respective main body portions 52. Continued pivotal movement of the door 22 toward the closed position results in the catch 44 passing over the shoulders 58 to be seated in the recessed terminal end portions of the spring clips 38 when the door 22 is in the closed position as shown in FIG. 3. As such, the door 22 is releasably secured in the closed position without the benefit of tools, mechanical fasteners or the like.

To gain access to the interior of the computer chassis 12 and housing 14, the user or service technician simply pulls on the grip and handle 24 to pivot it toward the open position. There are no tools, mechanical fasteners or other cumbersome and difficult to manipulate components. It should be readily appreciated that although a specific latch design is shown and described with respect to this embodiment of the invention, other latch mechanisms are within the scope of this invention. Furthermore, the latch could be mounted on the housing and the catch mounted on the door for selective engagement in the closed position as an alternative to the arrangement shown in FIGS. 1–3.

Figure 4:
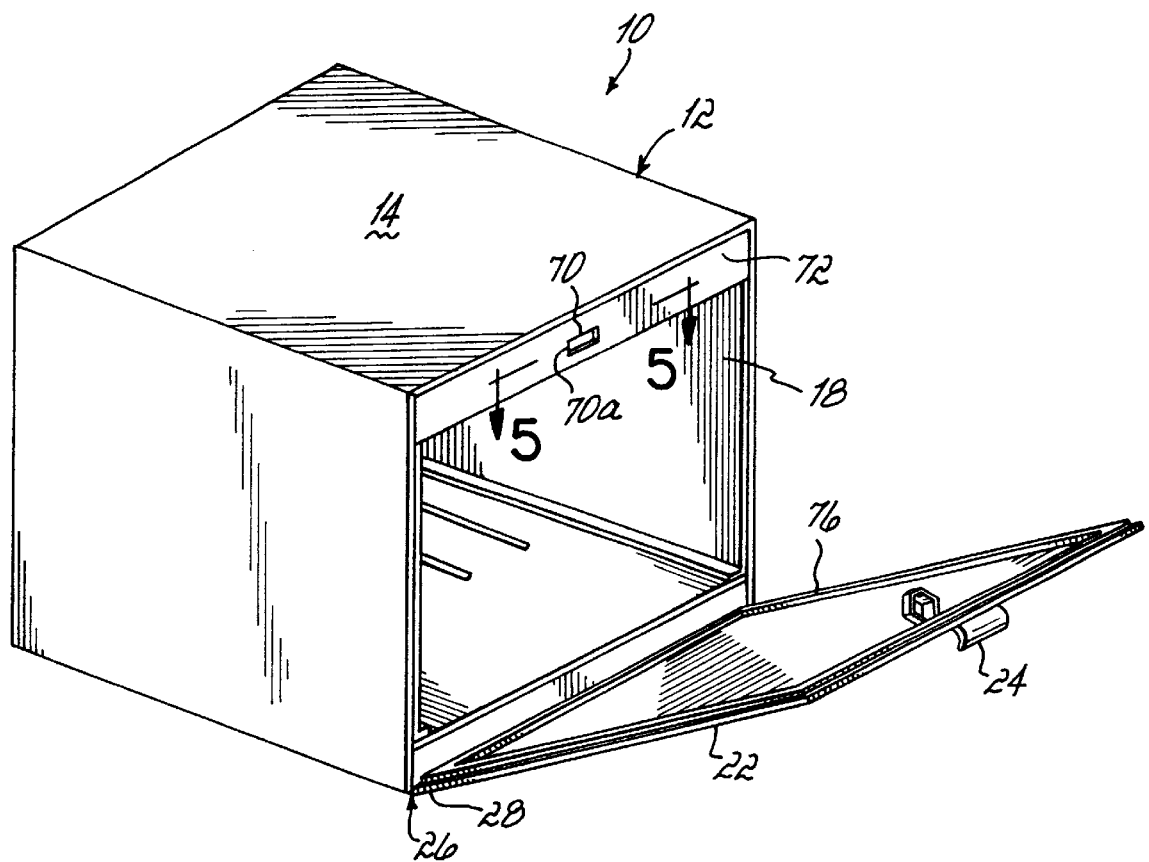
FIG. 4 is a perspective view of an alternative present embodiment of a computer related device with an access door and latch according to this invention.
Figure 5:
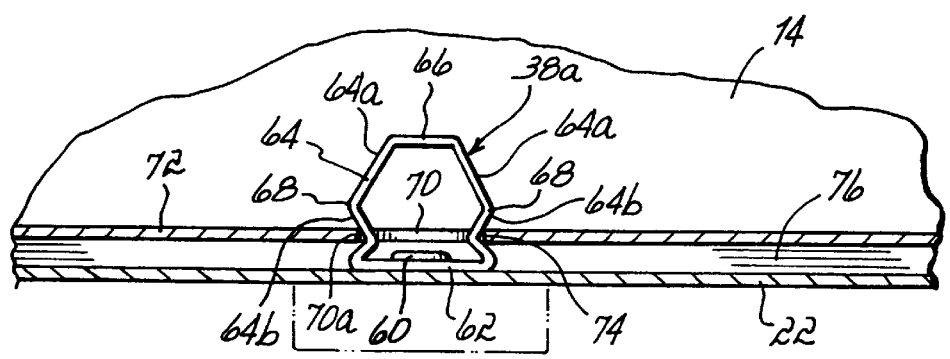
FIG. 5 is a cross-sectional view taken along line 5—5 of FIG. 4 with the door in a closed configuration compressing a seal around the access opening.

An alternative embodiment of the present invention is shown in FIGS. 4–5 in which like reference numerals identify similar components of the invention with respect to the first embodiment shown in FIGS. 1–3. Referring to FIGS. 4 and 5, a computer related device 10 with the chassis 12 is shown in the form of a direct access storage device (DASD) cage. The chassis or DASD cage 12 includes the access opening 18 which is selectively closed and opened by the door 22 that is pivotally coupled along a lower edge 28 to the DASD cage 12 by the hinge assembly 26. The door 22 includes the grip or handle 24 for manual or other manipulation of the door 22 by a user or service technician. This embodiment of the invention includes a latch 36 comprising a single spring clip 38a secured to the door 22 by a bolt or fastener 60 as shown in FIG. 5. The spring clip 38a includes a base 62 which is mounted to an inside face of the door 22 and a pair of identically configured spring clip arms 64 which are joined together at one end by the base 62 and at an opposite end by a bight portion 66 of the spring clip 38a. Each spring clip arm 64 includes upper and lower arm portions 64a, 64b joined together by a shoulder or bend 68 as shown particularly in FIG. 5. The spring clip 38a on the door 22 snaps into engagement with a generally rectangular-shaped catch opening or aperture 70 in a flange 72 of the DASD cage or chassis 12. Specifically, when the door 22 is manually pivoted toward the closed position, the bight portion 66 of the spring clip 38a enters the catch opening 70 and the two lower spring arm portions 64b of the spring clip 38a engage the respective vertical side edges 70a of the catch opening 70. Continued movement of the door 22 towards the closed position squeezes or flexes the spring clip 38a until the shoulder portions 68 are forced past the vertical side edges 70a of the catch opening 70 to seat a narrowed throat region 74 of the spring clip 38a in the catch opening 70 as shown in FIG. 5.

The door 22 is releasably secured in the closed position for selective opening by a user or service technician by grasping the handle 24 or manually manipulating the door 22 to pivot it downwardly and thereby force the spring clip 38a to contract and dislodge from the catch opening 70 and overcome the spring bias of the latch 36.

The embodiment of the computer related device 10 shown in FIGS. 4 and 5 includes a seal or gasket 76 on the door 22 which surrounds the access opening 18 when the door 22 is in the closed position. The seal or gasket 76 provides an EMC barrier between the internal volume of the chassis or DASD cage 12 and the external environment to thereby protect components 20 inside the chassis 12. It is important that the door 22 be well grounded to the computer related or other electronic device chassis 12 with a continuous conductive seal between the door 22 and the chassis 12 along the perimeter of the access opening 18. Typically, the seal or gasket 76 is compressible to form a tight seal between the door 22 and DASD cage or chassis 12 when the door 22 is in the closed position as shown in FIG. 5. As such, reaction forces due to the compression of the seal or gasket 76 urge the door 22 toward the open position. The seal or gasket 76 can generate significant reaction forces when compressed. The latch 36 of this invention can be configured or optimized to counteract or account for the compression reaction forces of the gasket 76 by optimizing the shape of the spring clip 38a and the material thicknesses of those components. The configuration of the latch 36, particularly the orientation of the upper arm portions 64a, shoulder 68 and throat 74, releasably retain the spring clip 38a in engagement with the catch 70 even in the presence of the compression forces of the seal 76. Such design flexibility is not readily available with screws, bolts or other fasteners requiring tools in the selective opening and closing of the door. Advantageously, the spring clip 38a is fabricated from a spring steel or the like, so that it is more resistant to the repeated opening and closing and potentially damaging effects of the engagement with the catch opening and metal chassis components.

Figure 6:
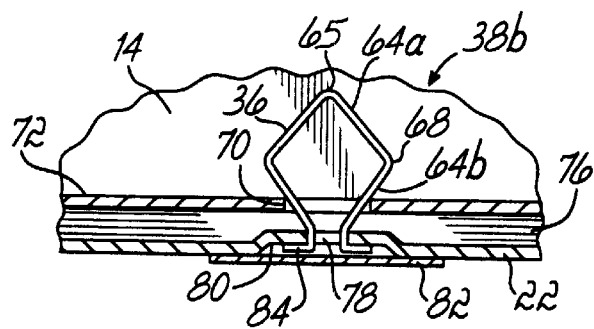
FIG. 6 is a view similar to FIG. 5 of a further alternative embodiment of a latch according to this invention.

A still further embodiment of this invention is shown in FIG. 6 in which a latch 38b releasably secures the door 22 to the DASD cage or computer chassis 12. The latch 38b is similar to that shown in FIGS. 4 and 5 with a spring clip 36 having a pair of spring clip arms 64 joined together at an apex 65. Each spring clip arm 64 includes the upper and lower arm portions 64a, 64b joined together at the shoulder or bend 68. The spring clip 38b on the door 22 snaps into engagement with the generally rectangular-shaped catch opening or aperture 70 in the flange 72 of the DASD cage or chassis 12.

The spring clip 38b includes a pair of oppositely projecting feet 84, each of which is joined to one of the clip arms 64. The feet 84 are inserted through an opening 78 in the door 22 by squeezing the shoulders 68 together and pivoting the feet 84 into the opening 78. When the spring clip 38b is installed on the door 22, the feet 84 may be seated in a recess 80 in the door 22. A cover plate 82, that may be a part of the handle 24 (not shown in FIG. 6), covers the feet 84 and the recess 80 on the exterior of the door 22.

The spring clip 38b can be configured or optimized to counteract or account for the compression reaction forces of the gasket 76 by optimizing the shape of the spring clip arms 64 and the material thicknesses of those components. The configuration of the latch 36, particularly the orientation of the upper arm portions 64a, shoulder 68 and throat 74, releasably retain the spring clip 38b in engagement with the catch 70 even in the presence of the compression forces of the seal 76. The spring clip 38b has been found to offer enhanced spring action relative to other designs, likely due to the mounting of the spring clip 38b by the feet 84 in the opening 78 of the door.

It should be readily understood that the seal or gasket 76 could be mounted on the chassis 12 surrounding the access opening 18 instead of the door 22 as shown in FIG. 4. Likewise, the configuration, design and arrangement of the catch and latch could be reversed, altered or modified within the scope of this invention. Nevertheless, the present invention does provide a biased latch that provides a secure but releasable closure for the door for convenient and easy manual, toolless manipulation of the door to and between closed and open positions for access to the interior of a computer related or other electronic device chassis.

From the above disclosure of the general principles of the present invention and the preceding detailed description of at least one preferred embodiment, those skilled in the art will readily comprehend the various modifications to which this invention is susceptible. Therefore, we desire to be limited only by the scope of the following claims and equivalents thereof.

What is claimed is:

1. A chassis for a computer comprising:

a housing;

an access opening in the housing through which access to the interior of the housing is available;

a door mounted to the housing for movement to and between closed and open positions in which the door inhibits access through the access opening when in the closed position and permits access through the access opening when in the open position;

a hinge coupling the door to the housing along an edge of the door;

a spring biased latch on the door to releasably secure the door in the closed position, wherein the latch is operable by a user for opening the door from the closed position and closing the door from the open position without the benefit of a tool;

wherein the latch further comprises
 a pair of similarly configured spring clip arms in which each spring clip arm is generally a mirror image of the other spring clip arm, each spring clip arm includes upper and lower arm portions joined together by a shoulder, the upper arm portions of the respective spring clip arms being coupled together and the lower portions of the respective spring clip arms being joined to a base of the latch which is mounted to the door;
 a catch opening in the housing separate from the access opening and cooperating with the latch to releasably secure the door in the closed position;
 a grip on the door for selectively opening and closing the door; and
 a compressible seal substantially surrounding the access opening and positioned between the housing and adjacent portions of the door when the door is in the closed position;

wherein the spring biased latch accounts for compression forces generated by the seal when the door is in the closed position.

2. The chassis of claim 1 wherein the seal is an EMC seal.

3. The chassis of claim 1 wherein each of the lower portions of the spring clip arms are joined to the base of the latch by a throat of each spring clip arm and the respective throats engage the catch opening to thereby retain the door in the closed position.

4. The chassis of claim 3 wherein the base further comprises:

a pair of feet on the latch, each foot projecting from one of the spring clip arms and being biased outwardly away from the other foot so that the latch is releasably mounted to the door by temporarily deflecting the feet toward one another and engaging a recess on the door.

5. The chassis of claim 1 wherein the catch opening further comprises:

a pair of spaced edges and each of the clip arms engage one of the edges to thereby retain the door in the closed position.

6. A chassis for a computer comprising:

a housing;

an access opening in the housing through which access to the interior of the housing is available;

a door mounted to the housing for movement to and between closed and open positions in which the door inhibits access through the access opening when in the closed position and permits access through the access opening when in the open position;

a hinge coupling the door to the housing along an edge of the door;

a spring biased latch on the door to releasably secure the door in the closed position, wherein the latch is operable by a user for opening the door from the closed position and closing the door from the open position without the benefit of a tool;

a grip on the door for selectively opening and closing the door; and a compressible seal substantially surrounding the access opening and positioned between the housing and adjacent portions of the door when the door is in the closed position;

wherein the spring biased latch accounts for compression forces generated by the seal when the door is in the closed position;

wherein the latch further comprises
 leg mounted to the door;
 a main body projecting generally perpendicularly from the leg;
 an arm projecting angularly from the main body;
 a terminal end portion projecting from the arm and having a recess to releasably engage catch on the housing.

* * * * *

UNITED STATES PATENT AND TRADEMARK OFFICE
CERTIFICATE OF CORRECTION

PATENT NO. : 6,595,605 B1
DATED : July 22, 2003
INVENTOR(S) : Raymond Floyd Babcock et al.

It is certified that error appears in the above-identified patent and that said Letters Patent is hereby corrected as shown below:

Title page,
Add item: -- [74] *Attorney, Agent or Firm* — Wood, Herron & Evans, LLP --

Column 8,
Line 50, "engage catch on the housing." should be -- engage a catch on the housing. --

Signed and Sealed this

Twenty-eighth Day of October, 2003

JAMES E. ROGAN
*Director of the United States Patent and Trademark Office*